United States Patent
He et al.

(10) Patent No.: US 8,352,813 B2
(45) Date of Patent: Jan. 8, 2013

(54) TRANSITION FAULT TESTING FOR A NON-VOLATILE MEMORY

(75) Inventors: Chen He, Austin, TX (US); Gary L. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 460 days.

(21) Appl. No.: 12/570,261

(22) Filed: Sep. 30, 2009

(65) Prior Publication Data

US 2011/0078521 A1   Mar. 31, 2011

(51) Int. Cl.
*G11C 29/00* (2006.01)

(52) U.S. Cl. ........................................ 714/718; 714/720

(58) Field of Classification Search .................. None
See application file for complete search history.

(56) References Cited

U.S. PATENT DOCUMENTS

| | | | |
|---|---|---|---|
| 6,321,320 B1 | 11/2001 | Fleischman et al. | |
| 7,031,866 B1 | 4/2006 | Behera et al. | |
| 2005/0086650 A1* | 4/2005 | Yates et al. | 717/139 |
| 2006/0218455 A1* | 9/2006 | LeClair et al. | 714/726 |
| 2006/0268608 A1* | 11/2006 | Noguchi et al. | 365/185.09 |
| 2007/0225928 A1* | 9/2007 | Gatzemeier et al. | 702/89 |
| 2009/0310408 A1* | 12/2009 | Lee et al. | 365/185.03 |

* cited by examiner

*Primary Examiner* — Guerrier Merant
(74) *Attorney, Agent, or Firm* — Joanna G. Chiu; James L. Clingan, Jr.

(57) ABSTRACT

A method is for testing a non-volatile memory. A base data pattern is defined for a first pageset of the non-volatile memory. The non-volatile memory has a plurality of pages which comprise words. The base pattern is arranged so that each bitpair of a plurality of bitpairs that includes one of a group consisting of even bitpairs and odd bitpairs formed from all of the words exhibits all possible bitpair transitions during sequential accesses of the pages of the plurality of pages. The base pattern is stored in the first pageset. The pages of the plurality of pages of the first pageset are accessed sequentially.

20 Claims, 10 Drawing Sheets

BITPAIR TRANSITION VALUES: 00 01 11 01 00 10 11 10 00 11 10 01 10 11 (NON-UNIQUE TRANSITION) 00 (NON-UNIQUE TRANSITION)

FIG. 4

PORTION OF PAGESET 0:

| | 01 | 23 | 45 | 67 | 89 | 1011 | 1213 | 1415 | 1617 | 1819 | 2021 | 2223 | 2425 | 2627 | 2829 | 3031 |
|---|---|---|---|---|---|---|---|---|---|---|---|---|---|---|---|---|
| PAGE 0, WORD 0 → | 00 | 01 | 11 | 01 | 00 | 10 | 11 | 00 | 01 | 11 | 00 | 10 | 11 | 00 | 11 | 00 |
| PAGE 1, WORD 0 → | 01 | 11 | 01 | 00 | 10 | 11 | 00 | 01 | 11 | 00 | 10 | 11 | 00 | 11 | 00 | 01 |
| PAGE 2, WORD 0 → | 11 | 01 | 00 | 10 | 11 | 00 | 01 | 11 | 00 | 10 | 11 | 00 | 11 | 00 | 01 | 11 |
| PAGE 3, WORD 0 → | 01 | 00 | 10 | 11 | 00 | 01 | 11 | 00 | 10 | 11 | 00 | 11 | 00 | 01 | 11 | 00 |
| PAGE 4, WORD 0 → | 00 | 10 | 11 | 00 | 01 | 11 | 00 | 10 | 11 | 00 | 11 | 00 | 01 | 11 | 00 | 10 |
| | 10 | 11 | 00 | 01 | 11 | 00 | 10 | 11 | 00 | 11 | 00 | 01 | 11 | 00 | 10 | 11 |
| | 11 | 00 | 01 | 11 | 00 | 10 | 11 | 00 | 11 | 00 | 01 | 11 | 00 | 10 | 11 | 00 |
| | 00 | 01 | 11 | 00 | 10 | 11 | 00 | 11 | 00 | 01 | 11 | 00 | 10 | 11 | 00 | 01 |
| | 10 | 11 | 00 | 10 | 11 | 00 | 11 | 00 | 01 | 11 | 00 | 10 | 11 | 00 | 01 | 10 |
| | 11 | 00 | 10 | 11 | 00 | 11 | 00 | 01 | 11 | 00 | 10 | 11 | 00 | 01 | 10 | 01 |
| ... | | | | | | | | | | | | | | | | |
| PAGE 15, WORD 0 → | 01 | 00 | 00 | 01 | 01 | 00 | 10 | 11 | 10 | 10 | 11 | 00 | 10 | 01 | 10 | 11 |
| WORD BIT NUMBER: | 01 | 23 | 45 | 67 | 89 | 1011 | 1213 | 1415 | 1617 | 1819 | 2021 | 2223 | 2425 | 2627 | 2829 | 3031 |

FIG. 5

| PAGESET 0: | WORD 0 | WORD 1 | WORD 2 | WORD 3 |
|---|---|---|---|---|
| PAGE 0 → | 0x1D2E326C, | 0x74B8C9B0, | 0xD2E326C1, | 0x4B8C9B07, |
| PAGE 1 → | 0x74B8C9B0, | 0xD2E326C1, | 0x4B8C9B07, | 0x2E326C1D, |
| PAGE 2 → | 0x2E326C1D, | 0x4B8C9B07, | 0x2E326C1D, | 0xB8C9B074, |
| PAGE 3 → | 0x4B8C9B07, | 0x2E326C1D, | 0xB8C9B074, | 0xE326C1D2, |
| PAGE 4 → | 0x2E326C1D, | 0xB8C9B074, | 0xE326C1D2, | 0x8C9B074B, |
| | 0xB8C9B074, | 0xE326C1D2, | 0x8C9B074B, | 0x326C1D2E, |
| | 0xE326C1D2, | 0x8C9B074B, | 0x326C1D2E, | 0xC9B074B8, |
| | 0x8C9B074B, | 0x326C1D2E, | 0xC9B074B8, | 0x26C1D2E3, |
| | 0x326C1D2E, | 0xC9B074B8, | 0x26C1D2E3, | 0x9B074B8C, |
| | 0xC9B074B8, | 0x26C1D2E3, | 0x9B074B8C, | 0x6C1D2E32, |
| | 0x26C1D2E3, | 0x9B074B8C, | 0x6C1D2E32, | 0xB074B8C9, |
| | 0x9B074B8C, | 0x6C1D2E32, | 0xB074B8C9, | 0xC1D2E326, |
| | 0x6C1D2E32, | 0xB074B8C9, | 0xC1D2E326, | 0x074B8C9B, |
| | 0xB074B8C9, | 0xC1D2E326, | 0x074B8C9B, | 0x1D2E326C, |
| | 0xC1D2E326, | 0x074B8C9B, | 0x1D2E326C, | 0x74B8C9B0, |
| PAGE 15 → | 0x074B8C9B, | 0x1D2E326C, | 0x74B8C9B0, | 0xD2E326C1 |

FIG. 6

PORTION OF
PAGESET 1 (AFTER XOR WITH PAGESET ADDR (0x1)):

```
PAGE 0, WORD 0 → 00 01 01 11 01 00 01 10 00 10 01 11 10 11 00 01
PAGE 1, WORD 0 → 01 11 11 01 00 10 11 10 10 00 11 00 01 10 10 11
PAGE 2, WORD 0 → 11 01 00 01 10 11 00 11 11 00 00 00 00 10 00 11
PAGE 3, WORD 0 → 01 00 10 11 11 00 11 00 00 11 11 01 01 00 01 10
PAGE 4, WORD 0 → 00 10 11 10 10 11 10 11 01 01 11 10 11 00 10 01
                 10 11 10 11 10 10 00 01 10 00 01 00 00 01 01 01
                 11 10 10 00 11 10 11 10 10 10 00 01 00 10 10 10
                 10 00 10 11 00 01 00 00 00 01 01 00 01 01 10 10
                 00 11 01 00 01 11 01 11 01 01 11 00 11 10 11 11
                 10 01 10 10 01 10 11 00 00 00 10 00 01 00 00 00
                 10 10 10 00 10 11 11 01 11 10 11 01 11 11 11 11
                 11 01 10 10 00 00 00 11 00 11 00 01 00 10 01 00
PAGE 15, WORD 0 → 00 00 00 11 01 10 01 10 11 00 11 00 10 10 01 10
WORD BIT NUMBER: 01 23 45 67 89 1011 1213 1415 1617 1819 2021 2223 2425 2627 2829 3031
```

CONTINUATION OF PAGESET 0 OF FIG. 6:

| | WORD 0 | WORD 1 | WORD 2 | WORD 3 |
|---|---|---|---|---|
| PAGE 16 → | 0x8E971936, | 0x3A5C64D8, | 0x69719360, | 0xA5C64D83, |
| PAGE 17 → | 0xBA5C64D8, | 0x69719360, | 0xA5C64D83, | 0x9719360E, |
| PAGE 18 → | 0x69719360, | 0xA5C64D83, | 0x9719360E, | 0xDC64D83A, |
| | 0x25C64D83, | 0x9719360E, | 0xDC64D83A, | 0x719360E9, |
| | 0x9719360E, | 0xDC64D83A, | 0x719360E9, | 0x464D83A5, |
| | 0x5C64D83A, | 0x719360E9, | 0x464D83A5, | 0x99360E97, |
| | 0x719360E9, | 0x464D83A5, | 0x99360E97, | 0x64D83A5C, |
| | 0xC64D83A5, | 0x99360E97, | 0x64D83A5C, | 0x1360E971, |
| | 0x19360E97, | 0x64D83A5C, | 0x1360E971, | 0xCD83A5C6, |
| | 0x64D83A5C, | 0x1360E971, | 0xCD83A5C6, | 0x360E9719, |
| | 0x9360E971, | 0xCD83A5C6, | 0x360E9719, | 0x583A5C64, |
| | 0x4D83A5C6, | 0x360E9719, | 0x583A5C64, | 0xE0E97193, |
| | 0xB60E9719, | 0x583A5C64, | 0xE0E97193, | 0x03A5C64D, |
| | 0x60E97193, | 0x03A5C64D, | 0x03A5C64D, | 0x8E971936, |
| PAGE 31 → | 0x83A5C64D, | 0x8E971936, | 0x3A5C64D8, | 0x69719360 |

...

TRANSITION FAULT TESTING FOR A NON-VOLATILE MEMORY

BACKGROUND

1. Field

This disclosure relates generally to non-volatile memories (NVMs), and more specifically, to transition fault testing for a non-volatile memory.

2. Related Art

NVMs are widely used in a variety of different applications. In some of these applications, such as in the automotive and medical fields, safety is key. Due, for example, to their large areas on chip and complex circuitries, NVMs are typically more prone to defects and faults, such as transition faults (including address and data transition faults), and thus need to be adequately tested. Furthermore, NVMs are typically slower to write (which includes erasing and programming) than other types of memories, such as static random access memory (SRAM). Therefore, the more often an NVM is written for testing, the greater the test time and thus cost.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 illustrates the possible transition values for a bitpair.

FIG. 5 illustrates a portion of a base data pattern for storage in the memory array of FIG. 3, in accordance with one embodiment of the present invention.

FIG. 6 illustrates a base data pattern, including the portion illustrated in FIG. 5, for storage in the memory array of FIG. 3, in accordance with one embodiment of the present invention.

FIG. 7 illustrates a portion of a data pattern generated from the portion of the base data pattern of FIG. 5 for storage in the memory array of FIG. 3, in accordance with one embodiment of the present invention.

FIG. 10 illustrates a portion of a base data pattern, which may be a continuation of the base data pattern of FIG. 6, for storage in the memory array of FIG. 3, in accordance with one embodiment of the present invention.

FIG. 11 illustrates a portion of a base data pattern, which may be a continuation of the base data pattern of FIG. 6, for storage in the memory array of FIG. 3, in accordance with one embodiment of the present invention.

DETAILED DESCRIPTION

Figure 1:
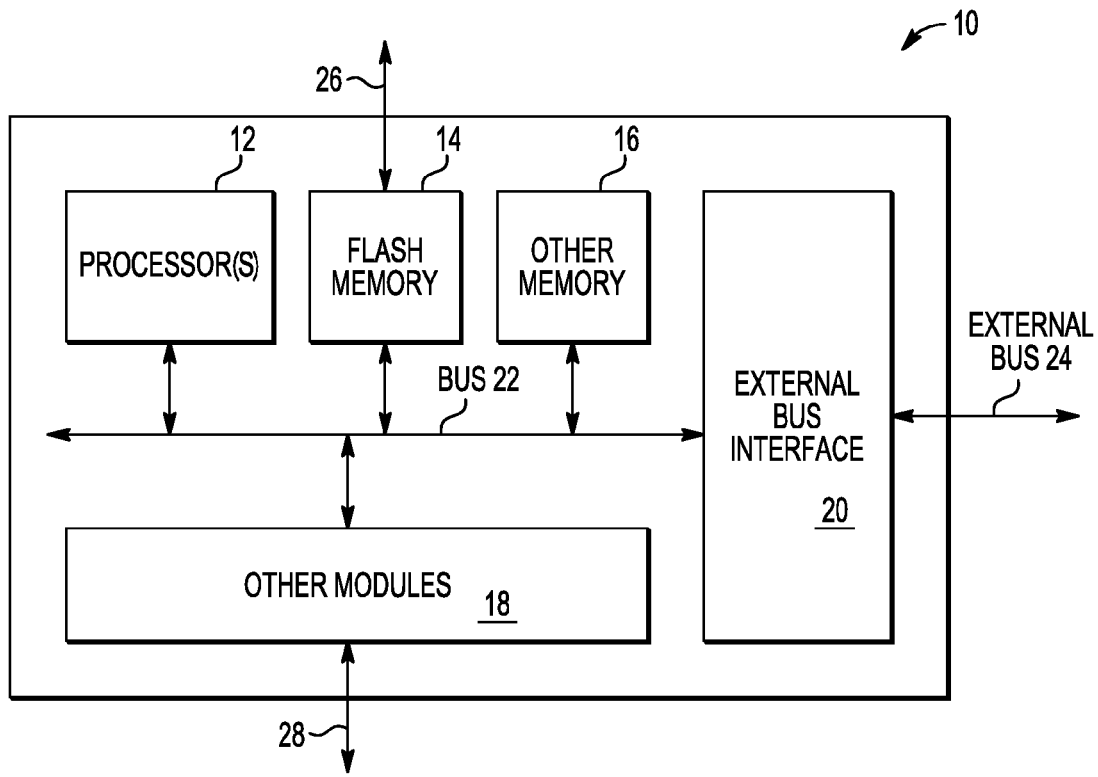
FIG. 1 illustrates, in block diagram form, a data processing system in accordance with one embodiment of the present invention.

In one embodiment, an NVM is tested by storing a background data pattern to the NVM array prior to testing the array. Subsequently, transition testing may be performed on the NVM array which stores the background data pattern. In one embodiment, both address transition testing and data transition testing may be performed for exhaustive data bit pair transitions on the NVM array using the same background data pattern, thus preventing the generating and storing of different background data patterns for address and data transition testing. A small table look-up with an XOR operation may be used to calculate the expected value. In one embodiment, a base data pattern is defined, from which the background data pattern is generated. In one embodiment, the base data pattern, and the resulting background data pattern, assure that all even bitpairs (or that all odd bitpairs) in all words exhibit all possible bitpair transitions during sequential page accesses to the NVM. In this manner, it can be determined whether data bits transitioned properly between sequential page accesses occurred. Also, in one embodiment, the base data pattern, and the resulting background data pattern, also assure that all pages store unique data such that it can be determined, using appropriate address sequences, whether the address bits transitioned appropriately. A transition fault occurs when a bit transition (either a data bit transition or an address bit transition) does not meet timing specifications. For example, transitional faults may occur when a particular bitcell, sense amplifier, address decoder or row driver is too slow to transition at the target operating frequency.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" or "0x" preceding a number indicates that the number is represented in its hexadecimal or base sixteen form. The symbol "%" or "0b" preceding a number indicates that the number is represented in its binary or base two form.

FIG. 1 illustrates, in block diagram form, a data processing system 10 in accordance with one embodiment of the present invention. In the illustrated embodiment, system 10 comprises one or more processors 12, a flash memory 14, one or more other memories 16, one or more other modules 18, and an external bus interface 20 which may be bi-directionally coupled by way of bus 22. Alternate embodiments may not have a processor 12, may not have other memory 16, may not have other modules 18, and/or may not have external bus interface 20. In the illustrated embodiment, external bus interface 20 is coupled to an external bus 24 which may be used to communicate information to and from system 10. Flash memory 14 is coupled to one or more integrated circuit terminals 26 which may be used to communicate information between flash memory 16 and circuitry (not shown) that is external to system 10. In alternate embodiments, one or more of modules 12, 16, and 18 may have one or more integrated circuit terminals (not shown) which may be used to communicate information to and/or from circuitry (not shown) that is external to system 10. Note that in some embodiments, system 10 may have only one or more flash memories, such as flash memory 14. Flash memory 14 may also be referred to as a non-volatile memory (NVM) where the descriptions provided herein for flash memory 14 could apply to any NVM. In one embodiment, all of system 10 may be formed on a single integrated circuit. Alternatively, multiple integrated circuits may be used to form system 10.

Figure 2:
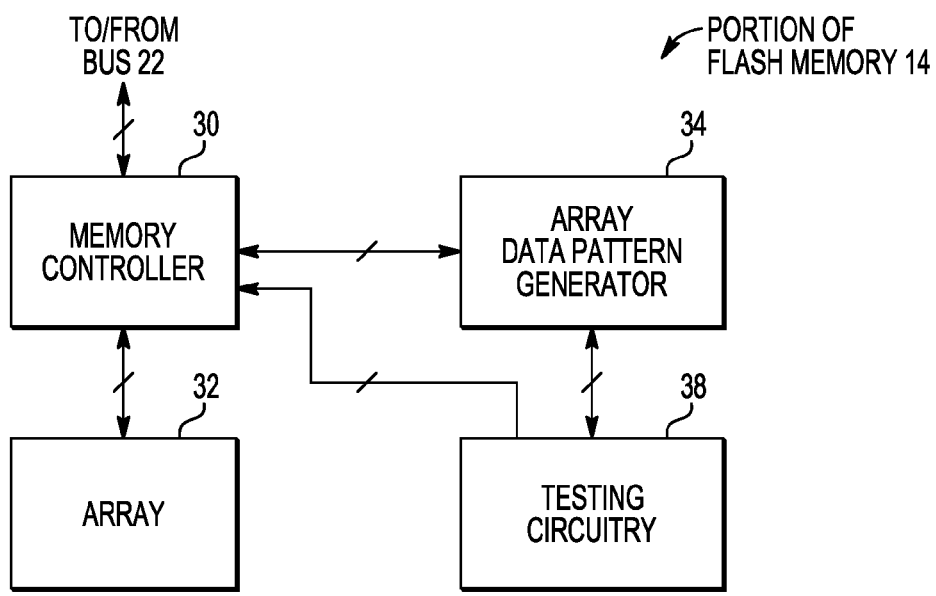
FIG. 2 illustrates, in block diagram form, a portion a flash memory of the data processing system of FIG. 1 in accordance with one embodiment of the present invention.

FIG. 2 illustrates, in block diagram form, a portion of flash memory 14, in accordance with one embodiment of the present invention. Flash memory 14 includes a memory controller 30, a memory array 32, an array data pattern generator 34, and testing circuitry 38. Memory controller 30 is bidirectionally coupled to bus 22, array 32, array data pattern generator 34, and testing circuitry 38. Array data pattern generator 34 is also bidirectionally coupled to testing circuitry 38.

Memory controller 30 and array 32 operate as known in the art to store information received from bus 22 via memory controller 30 into array 32 and provide information from array 32 to bus 22 via memory controller 30. Testing circuitry 38 is used to test array 32 to ensure that, during a test mode, the test data that is read from array 32 in fact matches the expected data in array 32. In one embodiment, testing circuitry 38 performs this testing to detect transition faults, including data transition faults and/or address transition faults. Therefore, prior to testing circuitry 38 testing array 32, an array data pattern needs to be written to array 32. In one embodiment, data pattern stored in array 32 is generated from a base pattern stored within array data pattern generator 34. Alternatively, the base pattern may be stored elsewhere within data processing system 10 or otherwise provided to array data pattern generator 24, such as via memory controller 30. Alternatively, the testing algorithm may be stored elsewhere within the data processing system 10. In one embodiment, and as will be discussed below, the particular array data pattern generated from the base pattern is one which allows for complete data transition testing. Also, in one embodiment, the generated array data pattern may also allow for complete address transition testing without having to program a new array data pattern to array 32. This may save test time since an erase of array 32 (which would be required in order to program a new array data pattern to array 32) is time consuming.

Figure 3:
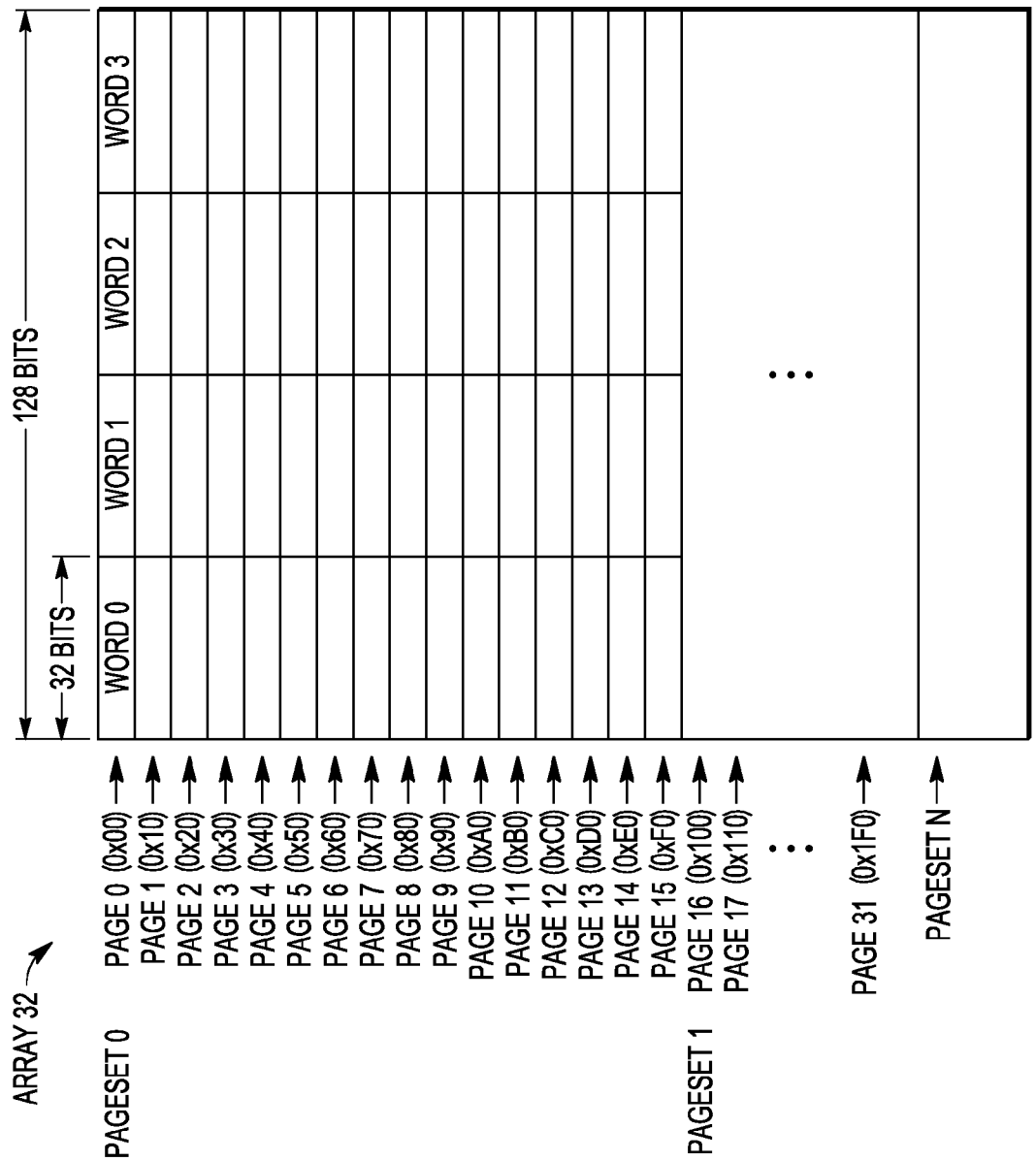
FIG. 3 illustrates, in memory organization form, a memory array of the flash memory of FIG. 2, in accordance with one embodiment of the present invention.

FIG. 3 illustrates, in block diagram form, array 32 of flash memory 14. In the illustrated embodiment, each line of array 32 corresponds to one page of array 32, where each page includes 4 32-bit words (word0, word1, word2, and word3). As used herein, a word includes 4 bytes (i.e. 4×8 bits). In one embodiment, each page also includes error correction code (ECC) bits (not illustrated in FIG. 3), where 8 ECC bits correspond to word0 and word1 and another 8 ECC bits correspond to word2 and word3. Note that ECC bits are generated by ECC circuitry based on the data bits and will be programmed to array 32 together with the data bits. However, in one embodiment, ECC bits are addressed separately from data bits and do not occupy any array 32 addresses. Therefore, in the illustrated embodiment, each page includes 128 data bits and 16 ECC bits, where array 32 may include any number of pages, depending on the design of memory 14. Note that each read from flash array 32 will fetch one page. Also, in one embodiment, no ECC bits may present, such that each page includes only 128 bits. In alternate embodiment, each page may include a different number of words, each word may include a different number of bytes, and thus each line may include a different number of bits than those illustrated in FIG. 3. In FIG. 3, it is assumed that array 32 begins at address 0x0. That is, the first page of array 32, page0, begins at 0x0, where word0 is located at 0x0, word1 at 0x4, word2 at 0x8, and word3 at 0xC. In one embodiment, array 32 is byte addressable. Therefore, the second page of array 32, page1, begins at 0x0 plus 16 bytes (i.e. 4 words of 4 bytes each=16 bytes), which is 0x10. Page3 begins 16 bytes later at 0x30, page4 begins at 0x40, page5 at 0x50, etc.

Also, in the illustrated embodiment, array 32 is also organized into pagesets where each pageset includes 16 sequential pages. For example, pageset0 includes page0-page15 and begins at address 0x0. Pageset1 includes page16-page31 and begins at address 0x100. Array 32 includes N+1 pagesets (pageset0 through pagesetN), where N depends on the number of pages within array 32 and the number of pages included in a pageset. As will be described in more detail below, a pageset may include more or less pages than 16. In one embodiment, a pageset includes a power of 2 number of pages, such as 16, 32, 64, etc. However, in the examples of FIGS. 5-7, a pageset will be defined as including 16 pages, for ease of illustration.

As discussed above, in the illustrated embodiment, an array data pattern is generated which allows for data transition testing in order to detect data transition faults. In order to do so, each sequential page should include at least one data bit transition to determine whether, upon being sequentially accessed, that data bit transition occurred. In one embodiment, a data pattern for a pageset is defined or generated which assures that all even bitpairs in all words exhibit all possible even bitpairs transitions during sequential page accesses in that pageset, or assures that all odd bitpairs in all words exhibit all possible odd bitpairs transitions during sequential page access, or assures that all adjacent bitpairs (i.e. both even and odd bitpairs) in all words exhibit all possible adjacent bitpair transitions during sequential page access.

Referring to FIG. 4, the first 14 values listed in FIG. 4 illustrates all possible transition values for a bitpair. That is, it is possible for a bitpair value of "00" to transition to either "01", "10", or "11". Similarly, it is possible for a bitpair value of "01" to transition to either "00", "10", or "11". It is possible for a bitpair value of "10" to transition to either a "00", "01", or "11", and it is possible for a bitpair value of "11" to transition to either a "00", "01", or "10". Therefore there are a total of 12 possible transitions for a bitpair. Since, in the current example there are 16 pages in a pageset, 2 additional bitpair transition values are included in FIG. 4, corresponding to "11" and "00" (corresponding to the last two values in FIG. 4). These are non-unique transition values because the transition of "10" to "11" is already handled in the 6$^{th}$ and 7$^{th}$ transition values of FIG. 4. Similarly, the transition of "11" to "00" is already handled in the 10$^{th}$ and 11$^{th}$ transition values of FIG. 4. However, in one embodiment, note that these two additional values of FIG. 4 will be useful to ensure all bitpair transitions when bitwise XORing with the pageset address for address transition fault testing.

Using the bitpair transition values of FIG. 4, a data pattern can be defined or generated for a pageset of array 32 which includes all bitpair transitions. FIG. 5 illustrates a portion 40 of a data pattern for storage into pageset0. For example, the portion of the data pattern illustrated in FIG. 5 represents, in binary form, the first word (word0) of each page in pageset0 (i.e. page0, word0 through page15, word0). Across the bottom of FIG. 5, the word bit number is provided in order to more easily refer to the particular bits of each word. Therefore, each row of FIG. 5 represents the data pattern to be stored into the word0s of pageset0 in array 32. Each word in data pattern of FIG. 5 is grouped by even bitpairs, where each even bitpair includes a bit located at an even word bit number and at the immediately adjacent bit location. Therefore, referring to page0, word0 (the first line of FIG. 5), the first even bitpair is "00" which is located at word bit numbers 0 and 1. The second even bitpair is "01" which is located at word bit numbers 2 and 3. The third even bitpair is "11" which is located at word bit numbers 4 and 5. Therefore, the first word bit number of each even bitpair is an even number (e.g. 0, 2, 4, etc.). Each word (word0-word3) in each page includes 16 even bitpairs.

Still referring to FIG. 5, note that each column of even bitpairs exhibits all the bitpair transition values illustrated in FIG. 4. That is, all the even bitpairs of all the word0s of pageset0 located at word bit numbers 0 and 1 exhibit all the bitpair transition values of FIG. 4. The same is true for all even bitpairs of all the word0s of pageset0 located at word bit numbers 2 and 3 (however, in this column, the bitpair transition values have been rotated up once in comparison with the column located at word bit numbers 0 and 1). The same is true for all even bitpairs of all the word0s of pageset0 located at word bit numbers 4 and 5 (however, in this column, the bitpair transition values have been rotated up once in comparison with the column located at word bit numbers 2 and 3). This pattern continues for all columns of bitpairs, and not only for word0, but for each of word1, word2, and word3, although they are not illustrated in FIG. 5. Therefore, when all pages in the pageset are accessed in a sequential manner (page0, then page1, then page2, etc.), all bitpair transitions of FIG. 4 are guaranteed to occur. This is true for all even bitpairs of pageset0.

FIG. 6 illustrates data pattern 41 for all of pageset0, in hexadecimal form. For example, note that FIG. 5 illustrates the first column of values of FIG. 6, but in binary form to better illustrate the bit value transitions. That is, note that the first row in FIG. 5 is the binary form (0b00011101001011100011001001101100) of page0, word0 (0x1D2E326C) in FIG. 6. Similarly, the second row in FIG. 5 is the binary form (0b01110100101110001100100110110000) of page1, word0 (0x074B8C9B0). Therefore, note that all even bitpairs in each of words 0-3 exhibit all possible even bitpair transitions with sequential page accesses.

In one embodiment, data pattern 41 is defined as a base data pattern for a pageset from which a data pattern for each of the other pagesets in array 32 can be generated. In one embodiment, the base data pattern is used as the generated data pattern for pageset0 (as illustrated in FIGS. 5 and 6), and then is used to generate the data patterns for pagesets1-N. Note that data pattern 41 allows for data transition testing which tests all possible data transitions for all even bitpairs in the pageset. However, if this same data pattern were used for all pagesets, it would not be possible to use the same data pattern form both data transition testing and address transition testing. That is, for testing address transitions, each page in array 32 should be different and each word with a same offset address in each page should be different. If the same data pattern were used for all pagesets, then page0 of pagesets1-N would each have the same value as page0 of pageset0. Therefore, in one embodiment, data pattern 41 is used to generate data patterns for the remaining pagesets which result in each page and each word with a same offset address in each page having a completely unique value while maintaining the desired data transitions.

FIG. 7 illustrates a portion 42 of a data pattern that is generated from data pattern 41 for storage into the next pageset, pageset1. The portion of FIG. 7 for pageset1 corresponds to the same portion in FIG. 5 for pageset0. That is, FIG. 7 illustrates the values, in binary form, for all the word0s of pageset1. In one embodiment, each subsequent data pattern is generated by performing a logical bitwise exclusive OR (XOR) between each word of the base data pattern (such as data pattern 41) with the current pageset address. For example, the pageset address of pageset0 is defined as 0x0, the pageset address of pageset1 is 0x1, the pageset address of pageset2 is 0x2, etc. Therefore, if there are 64 pagesets, the pageset address would range from 0x0 to 0x3F. The current pageset address therefore corresponds to the address of the pageset for which the data pattern is currently being generated. Therefore, for FIG. 7, the current pageset address is 0x1 since data pattern 42 is being generated for storage in pageset1. Therefore, note that as compared with portion 40 of FIG. 5, the last bit column (at word bit number 31), has the inverse bit value for each bit in the bit column since the last bit column of portion 40 has been XORed with 0x1. Note that the XORing is done for each word of each page. Therefore, page0, word1 of pageset1 would be the result of XORing page0, word1 of the base data array (e.g. pageset0) and the current pageset address (e.g. 0x1).

Therefore, note that the generated data pattern for pageset1 also assures that all even bitpairs in all words of pageset1 exhibit all possible even bitpair transitions during sequential page accesses to pageset1. That is, the XORing of the base data pattern with a value does not change this feature. This can be shown in that, for example, the XOR will result in either 0 or 1 or 2 bits being inverted for each even bitpair, and for all cases all possible even bitpair transitions are assured. In addition, the XORing ensures that each page and each word with a same offset address in each page has a unique value from any other word. A data pattern for each subsequent pageset would be generated in a same manner, where the same base data array (such as the data array of pageset0) would be used to perform the XORing with the current pageset address to generate the data pattern. For example, for pageset 13, the data pattern is generated by performing a bitwise XOR between each word of the base data pattern (such as data pattern 41) with the current pageset address, 0xD.

Figure 8:
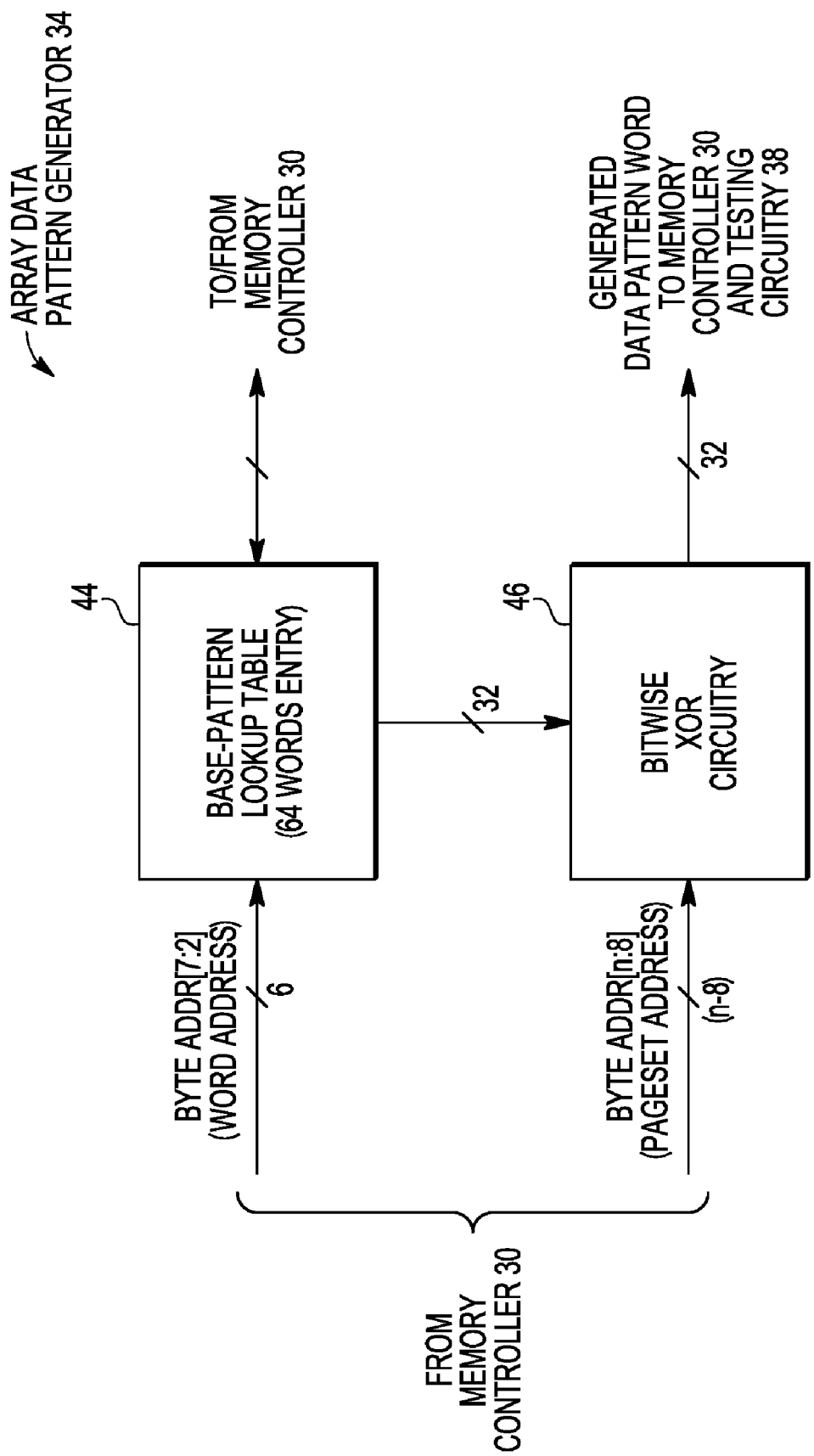
FIG. 8 illustrates, in block diagram form, the array data pattern generator of FIG. 2, in accordance with one embodiment of the present invention.

FIG. 8 illustrates, in block diagram form, a portion of array data pattern generator 34 in accordance with one embodiment of the present invention. Array data pattern generator 34 includes a base pattern lookup table 44 coupled to bitwise XOR circuitry 46. In one embodiment, a byte addressable access address, byte addr[n:0] is received from memory controller 30 when array 32 is to be programmed or read from. Therefore, n is the total number of byte address range bits and depends on the size of array 32. In the illustrated embodiment, the base data pattern is stored in the form of a lookup table containing 64 word entries (16 pages×4 words each for an array page size of 4 words). To access a word of the base pattern to generate a data pattern, the $2^{nd}$ through $7^{th}$ bits of the access address (byte addr[7:2]) is used. The 32-bit accessed word of the base pattern is then provided to bitwise XOR circuitry 46 which performs a bitwise XOR with the current pageset address zero extended to 32 bits. In one embodiment, the current pageset address corresponds to bits 8 through n of the access address (byte addr[n:8]) since, in the current example, each pageset includes 16 pages of 4 words each, thus requiring 8 bits ([7:0]) of addressing. Bitwise XOR circuitry 46 performs a bitwise XOR between the currently accessed word from base pattern lookup table 44 and the current pageset address zero extended to 32 bits to provide a 32-bit generated data pattern word to memory controller 30 and/or testing circuitry 38. For example, during programming of array 32 with the background data pattern, the generated data pattern word can be provided to memory controller 30 for programming into array 32. During testing of array 32, the 32-bit generated data pattern may be provided to testing circuitry 38 for comparison with the actual read value provided by memory controller 30 from array 32. In other embodiments of the present invention, where for example the array page size includes 8 words, the base pattern look-up table would be 128 words, the look-up address would be byte addr[8:2], and the pageset address would be byte addr[n:9].

In one embodiment of the present invention, simple and highly efficient embedded software, namely, a software-based data pattern generator, can be used to calculate the expected data at any array address for testing purpose.

Figure 9:
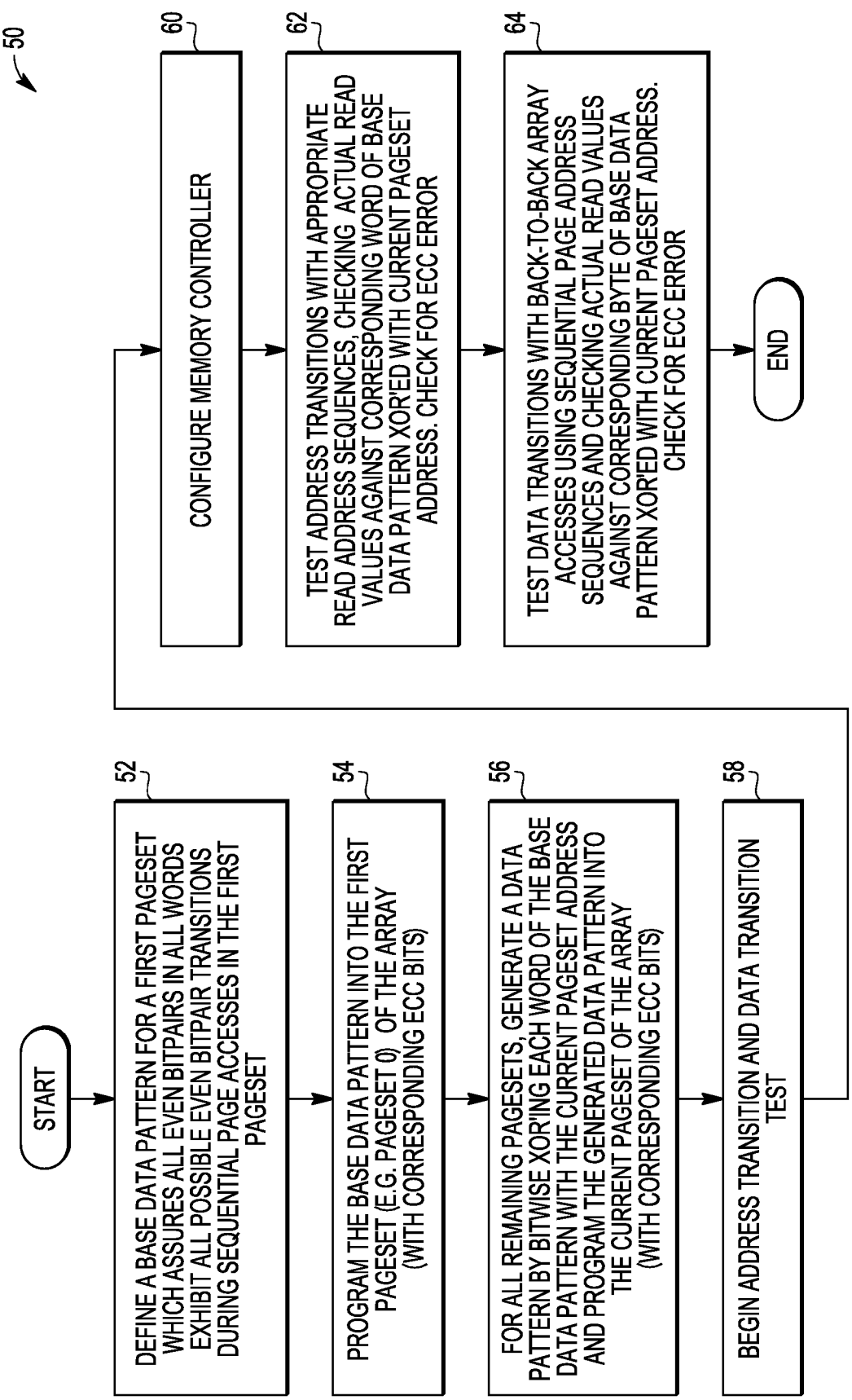
FIG. 9 illustrates, in flow diagram form, a method for generating a data pattern for storage into the memory array of FIG. 3 and for testing the memory array of FIG. 3, in accordance with one embodiment of the present invention.

FIG. 9 illustrates, in flow diagram form, a method for generating a data pattern that is stored into array 32 and testing array 32. Flow 50 begins with start and proceeds to block 52 in which a base data pattern (e.g. data pattern 41) is defined for a first pageset (e.g. pageset0) which assures all even bitpairs in all words exhibit all possible even bitpair transitions during sequential page accesses in the first pageset (e.g. pageset0). Note that this base data pattern can be stored as a lookup table or in any other format in circuitry 44 or elsewhere in the data processing system 10. Flow then proceeds to block 54 in which the base data pattern are programmed into the first pageset (e.g. pageset0) of the array (along with corresponding ECC bits programmed elsewhere in the array). Note that the ECC bits can be generated as known in the art for word0/word1 and then for word2/word3. Also, note that array 32 can be programmed as known in the art. For example, the flash block containing the pageset is first erased (if not erased yet) and subsequently, the base data pattern is written to the pageset. Flow then proceeds to block 56 where, for all remaining pagesets (e.g. for each of pageset1-N), a data pattern is generated by bitwise XORing each word of the base data pattern with the current pageset address and programming the generated data pattern into the current pageset of the array (along with corresponding ECC bits programmed elsewhere in the array). (Note that the generated data patterns may also be referred to as altered data patterns which are derived from the base data pattern.) Note that if ECC is not used, there may be no ECC bits generated or stored in array 32. Alternatively, the ECC bits may be stored in a different location. Upon completion of block 56, note that all pagesets in array 32 have been programmed with a generated data pattern (each generated from the base data pattern). In each pageset set, the generated data pattern assures that all even bitpairs in all words exhibit all possible even bitpair transitions during sequential page access. Also, the base pattern and generated data pattern assures that all pages and all words with the same offset address in each page have unique values.

Flow then proceeds to block 58, in which, after all of array 32 has been programmed with the background data array, address and data transition testing begins. Flow then proceeds to block 60 in which memory controller 30 can be configured for testing. In one embodiment, memory controller 30 may be configured to perform aggressive testing such as by using strict timing requirements. In an alternate embodiment, the data processing system 10 can instead perform the address and data transition testing.

Flow then proceeds to block 62 in which address transitions are tested using appropriate read address sequences, in which actual read values are checked against expected values (which corresponds to the corresponding word of the base data pattern XORed with the current pageset address) and are checked for ECC errors. For example, for each read access, array 32 is accessed to obtain the actual read value from the access address. This actual read value is then checked against the expected value, which can be determined by XORing the corresponding words of the base data pattern with the current pageset address. Also, for each read access, if ECC is used, the actual read value is checked for any ECC errors. In one embodiment, if ECC errors are detected, they are not corrected. In one embodiment, the address sequences used for this test includes every address in array 32. Note that any appropriate address sequences can be used, such as those known in the art, such as, for example, any-bit-fast, walking 1s/0s across address bits, address complement, etc, to ensure all address bit transitions are tested.

Flow then proceeds to block 64 in which data transitions are tested with back-to-back array accesses using sequential page address sequences, in which actual read values are checked against expected values (which corresponds to the corresponding word of the base data pattern XORed with the current pageset address) and are checked for ECC errors. In one embodiment, back-to-back array accesses of array 32 are accesses which do not include any intervening read or write accesses of array 32. In one embodiment, each page is sequentially accessed in which the actual read value of at least a portion of the page is checked against the expected value, which can be determined by XORing the corresponding data of the base data pattern with the current pageset address. In one embodiment, with each page access, only one byte of the page is checked for data transition faults. For example, for page0, the $16^{th}$ byte of the actual read value may be checked against its expected value (which can be determined by XORing the corresponding word of the base data pattern with the current pageset address zero extended to 32 bits). For the next back-to-back sequential page access, page1, the $15^{th}$ byte of the actual read value may be checked against its expected value. For the next back-to-back sequential page access, page2, the $14^{th}$ byte of the actual read value may be checked against its expected value, etc. In one embodiment, since each read access to array 32 fetches one page which is checked by ECC, it is sufficient to compare only one byte of each page access to an expected value, and check the rest of the bytes in the page via checking if there is any ECC error during the page access. Alternatively, in one embodiment, the page accesses may be mostly sequential such that, for example, with a first page access (such as page0), byte 0 and byte 16 are checked, but for the 15 subsequent pages (such as page1-page15), only a single byte is checked. Alternate embodiments may use other types of algorithms for performing the data testing. In one embodiment, address transition testing of block 62 may not be performed. In this embodiment, it may be desirable, during data transition testing, to test every word in every page with each sequential page access. Also, in an alternate embodiment, data transition testing may be performed prior to address transition testing. After block 64, flow 50 ends.

Therefore, note that the same background data pattern generated by blocks 52, 54, and 56 of flow 50 can be used to perform both address transition testing and data transition testing. That is, test time is conserved by not having to re-program array 32 with a different background data pattern between address transition testing and data transition testing, while assuring that all even bit pair transitions occur.

Figure 10:
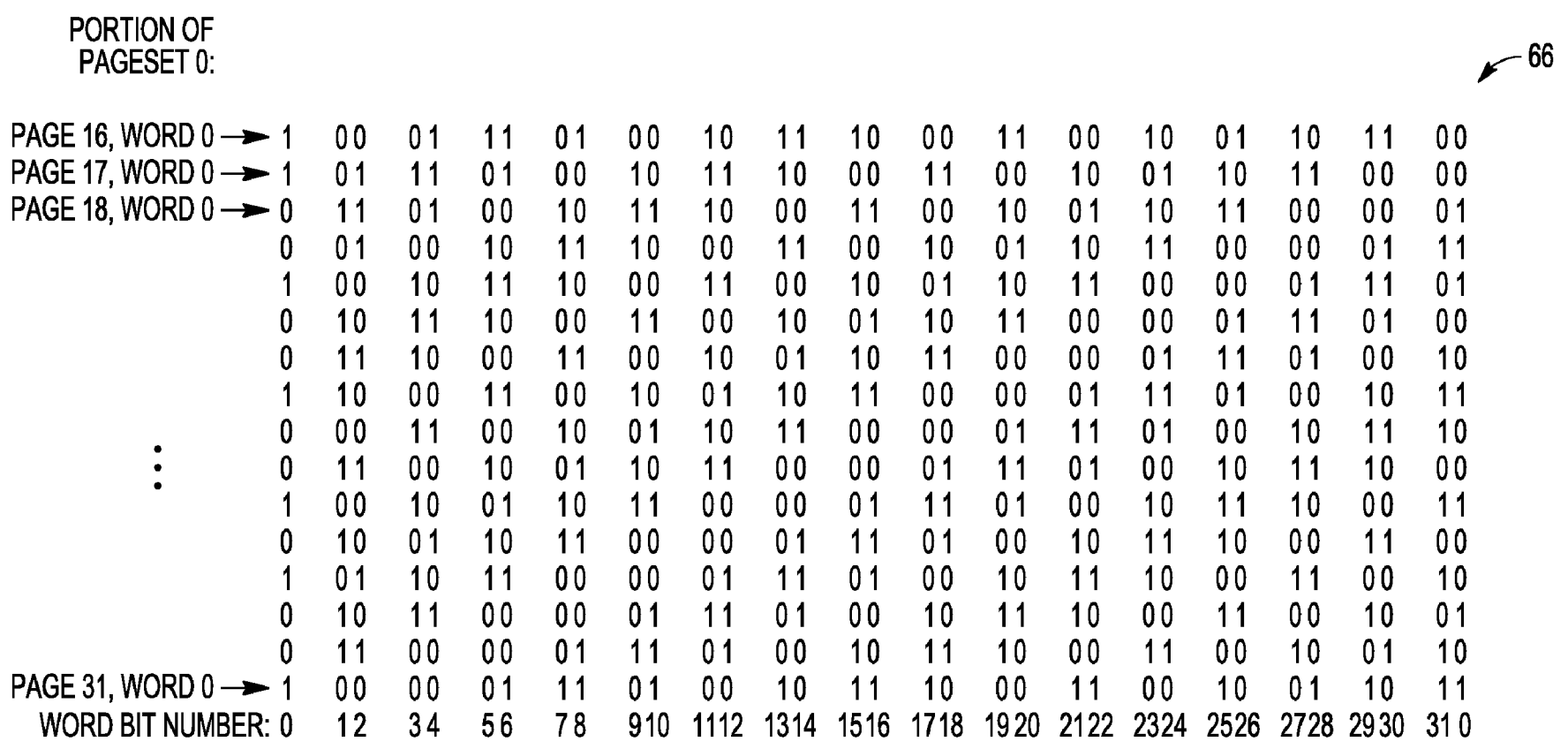

In the descriptions provided above, it was assumed that a pageset included 16 pages. However, in alternate embodiments, a pageset may be defined to include more pages. FIG. 10 illustrates a portion 66 of a data pattern which may be used as a continuation of data pattern 41 for storage into pageset0. That is, in the example of FIG. 10, a pageset can be defined to include 32 pages rather than 16 pages, and in this example, the base data pattern and the data patterns generated from the base data patter for storage into a pageset of array 32 would all include 32 pages of data rather than 16 pages of data. Also, data pattern 41 described above assures that all even bitpairs in all words exhibit all possible even bitpair transitions during sequential page accesses of the pageset. However, portion 66 of FIG. 10 assures that all odd bitpairs in all words exhibit all possible odd bitpair transitions (as shown in FIG. 4) during sequential page accesses. For example, the portion of the data pattern illustrated in FIG. 10 represents, in binary form, the first word (word0) of each of page16-31 pageset0 (i.e. page16, word0 through page31, word0). Across the bottom of FIG. 10, the word bit number is provided in order to more easily refer to the particular bits of each word. Each word in data pattern of FIG. 10 is grouped by odd bitpairs, where each odd bitpair includes a bit located at an odd word bit number and at the immediately adjacent bit location. Therefore, referring to page0, word0 (the first line of FIG. 10), the first odd bitpair is "00" which is located at word bit numbers 1 and 2. The second odd bitpair is "01" which is located at word bit numbers 3 and 4. The third odd bitpair is "11" which is located at word bit numbers 5 and 6. Therefore, the first word bit number of each odd bitpair is an odd number (e.g. 1, 3, 5, etc.). Note that the first column of bits at bit location 0 can be paired with the last bit location of the page (the bits at word bit number 31 of word3). Note that the second 16 pages in a pageset can be derived by simply right shifting and rotating 1 bit from the first 16 pages in the same pageset. Therefore, each page of pages16-31 includes 64 (16×4) odd bitpairs. Note also that the odd bitpairs cross word boundaries of a page. For example, the bits located at word bit number 31 of one word (e.g. word0) are paired into an odd bit pair with the bits located at word bit number 0 of the subsequent word (e.g. word1). Note that the bits at word bit number 0 of word1 are illustrated as the last column of portion 66 in FIG. 10.

FIG. 11 illustrates data pattern 68 for all words in pages16-31 of pageset0, in hexadecimal form. For example, note that FIG. 10 illustrates the first column of values of FIG. 11, but in binary form to better illustrate the bit value transitions. That is, note that the first row in FIG. 10 is the binary form (0b10001110100101110001100100110110) of page16, word0 (0x8E971936) in FIG. 11. Similarly, the second row in FIG. 10 is the binary form (0b10111010010111000110010011011000) of page1, word0 (0xBA5C64D8). Therefore, note that all odd bitpairs in each of words 0-3 exhibit all possible odd bitpair transitions with sequential page accesses.

Therefore, data pattern 41 for pages0-15 and data pattern 68 for pages16-31 together can correspond to a data pattern for a 32-page pageset. In one embodiment, data pattern 41 and 68, together, are defined as the base data array pattern (which may be stored in pageset0) from which the data patterns for each of the remaining pagesets (e.g. pagesets1-N/2) can be generated. The same method of generating the generated data patterns described above can be used in which a data pattern for a current pageset is generated by bitwise XORing each word of the base data pattern with the current pageset address. Note that, in this example, referring back to FIG. 8, byte addr[8:2] would now be used to access the appropriate word of the base pattern (in base pattern lookup table 44) since one more addressing bit is required to address 32 pages as compared to 16 pages, and the current pageset address for use in the XORing (such as by bitwise XOR circuitry 46) would now be provided by byte addr[n:9].

Therefore, by using data patterns 41 and 68 together, the resulting 32-page data pattern can assure that all adjacent bit pairs (including both even and odd bitpairs) in all words exhibit all possible bitpair transitions during sequential page access of the pageset. For example, adjacent pairs may include those bit pairs located at word bit number 0 and 1, then 1 and 2, then 2 and 3, then 3 and 4, then 4 and 5, etc., where adjacent pairs includes an interleaving of even and odd bitpairs. The XORing would still allow for a unique value to be stored at each page and each word at the same offset in each page so as to allow for address transition testing. Therefore, the testing (address transition testing and/or data transition testing) may still be performed as described above in reference to FIG. 9.

In an alternate embodiment, data pattern 41 may be stored as a first base data pattern for a 16-page pageset from which all even pagesets are generated and data pattern 68 may be stored as a second base data pattern for a 16-page pageset from which all odd pagesets are generated. For example, any number of base patterns may be defined. For example, data pattern 41 may be stored in pageset0 and data pattern 68 may be stored in pageset1. The data pattern for pagesets 2, 4, 6, etc. can be generated from data pattern 41 as described above (by bitwise XORing each word of data pattern 41 with the current pageset address), and the data pattern for pagesets 3, 5, 7, etc. can be generated from data pattern 68 as described above (by bitwise XORing each word of data pattern 68 with the current pageset address).

By now it should be appreciated that there has been provided a method for generating a background data pattern for use in testing an NVM array which allows for improved data transition testing and which may also allow for address transition testing. By including all bitpair transitions of FIG. 4, improved data transition testing coverage may be achieved. Also, the ability to use a same background data pattern for both address transition testing and data transition testing may allow for improved test time which may further reduce cost.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, other types of NVMs other than flash memory can be programmed and tested as described above. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following includes various embodiments of the present invention.

Item 1 includes a method of testing a non-volatile memory, including defining a base data pattern for a first pageset of the non-volatile memory having a plurality of pages, wherein the pages include words, wherein the base data pattern is arranged so that each bitpair of a plurality of bitpairs that comprises one of a group consisting of even bitpairs and odd bitpairs formed from all of the words exhibits all possible bitpair transitions during sequential accesses of the pages of the plurality of pages; storing the base data pattern in the first pageset; and sequentially accessing the pages of the plurality of pages of the first pageset. Item 2 includes the method of item 1, wherein the non-volatile memory is further characterized as having error detection, and wherein the sequentially accessing is further characterized as reading at least a subset of the pages of the first pageset and invoking the error detection for each page of the first pageset. Item 3 includes the method of item 2, and further includes reading the first pageset according to an address transition pattern. Item 4 includes the method of item 1, and further includes using the base data pattern to derive altered data patterns for remaining pagesets; loading the altered data patterns in the remaining pagesets; and accessing the remaining pagesets. Item 5 includes the method of item 4, wherein the using comprises bitwise XORing of at least a portion of each of the addresses of the remaining pagesets with the base data pattern. Item 6 includes the method of item 4, wherein using the base data pattern comprises using a base pattern lookup table and bitwise XOR circuitry to generate the altered data patterns. Item 7 includes the method of item 4, wherein the non-volatile memory is further characterized as having error correction, wherein the sequentially accessing is further characterized as reading at least a subset of the pages of the first pageset and invoking the error detection for each page of the first pageset and the accessing the remaining pagesets is further characterized as reading at least a subset of each of the remaining pagesets and invoking the error detection for each page of the remaining pagesets. Item 8 includes the method of item 7, and further includes reading all of the remaining pagesets and the first pageset. Item 9 includes the method of item 8, wherein the reading is further characterized as being performed according to an address transition pattern. Item 10 includes the method of item 9, wherein the non-volatile memory is further characterized as having error detection, and wherein the sequentially accessing is further characterized as invoking the error detection for each page of the first pageset and the accessing the remaining pagesets is further characterized as invoking error detection for each page of the remaining pagesets.

Item 11 includes a method of testing a non-volatile memory, including defining a base data pattern for a first pageset of the non-volatile memory having a plurality of pages having a first subset of pages and a second subset of pages, wherein the pages of the plurality of pages comprise words, wherein the base data pattern is arranged so that each bitpair of the first subset of pages includes even bitpairs from all of the words of the first subset of pages and that each bitpair of the second subset of pages comprise odd bitpairs formed from all of the words of the second subset of pages, wherein the base data pattern exhibits all possible bitpair transitions of the even bitpairs during sequential accesses of the pages of the first subset of pages and all possible bitpair transitions of the odd bitpairs during sequential accesses of the pages of second subset of pages; storing the base data pattern in the first pageset; and sequentially accessing the pages of the plurality of pages of the first pageset. Item 12 includes the method of item 11, wherein the non-volatile memory is further characterized as having error detection, and wherein the sequentially accessing is further characterized as reading at least a subset of the pages of the first pageset and invoking the error detection for each page of the first pageset. Item 13 includes the method of item 12, and further includes reading the first pageset according to an address transition pattern. Item 14 includes the method of item 11, and further includes using the base data pattern to derive altered data patterns for remaining pagesets; loading the altered data patterns in the remaining pagesets; and accessing the remaining pagesets. Item 15 includes the method of claim 14, wherein the using comprises bitwise XORing at least a portion of the address of each of the remaining pagesets with the base data pattern. Item 16 includes the method of item 15, wherein the non-volatile memory is further characterized as having error detection, and wherein the sequentially accessing is further characterized as reading at least a subset of the pages of the first pageset and invoking the error detection for each page of the first pageset and the accessing the remaining pagesets is further characterized as reading at least a subset of each of the remaining pagesets and invoking the error detection for each page of the remaining pagesets. Item 17 includes the method of item 16, and further includes reading all of the remaining pagesets and the first pageset according to an address transition pattern.

Item 18 includes a method of testing a non-volatile memory, including defining a base data pattern for a first pageset of the non-volatile memory having a plurality of pages, wherein the pages comprise words, wherein the base data pattern is arranged in even bitpairs formed from all of the words and exhibits all possible even bitpair transitions during sequential accesses of the pages of the plurality of pages; storing the base data pattern in the first pageset; sequentially accessing the pages of the plurality of pages of the first pageset; using the base data pattern to derive altered data patterns for remaining pagesets; loading the altered data patterns in the remaining pagesets; and accessing the remaining pagesets. Item 19 includes the method of item 18, wherein the using includes bitwise XORing at least a portion of each of the addresses of the remaining pagesets with the base data pattern. Item 20 includes the method of item 18, wherein the non-volatile memory is further characterized as having error detection, and wherein the sequentially accessing is further characterized as reading at least a subset of the pages of the first pageset and invoking the error detection for each page of the first pageset.

What is claimed is:

1. A method of testing a non-volatile memory, comprising:
defining a base data pattern for a first pageset of the non-volatile memory having a plurality of pages, wherein the pages comprise words, wherein the base data pattern is arranged so that each bitpair of a plurality of bitpairs that comprises one selected from the group consisting of even bitpairs and odd bitpairs formed from all of the words exhibits all possible bitpair transitions during sequential accesses of the pages of the plurality of pages;
storing the base data pattern in the first pageset; and
sequentially accessing the pages of the plurality of pages of the first pageset.

2. The method of claim 1, wherein the non-volatile memory is further characterized as having error detection, wherein the sequentially accessing is further characterized as reading at least a subset of the pages of the first pageset and invoking the error detection for each page of the first pageset.

3. The method of claim 2, further comprising reading the first pageset according to an address transition pattern.

4. The method of claim 1, further comprising:
using the base data pattern to derive altered data patterns for remaining pagesets;
loading the altered data patterns in the remaining pagesets; and
accessing the remaining pagesets.

5. The method of claim 4, wherein the using comprises bitwise XORing of at least a portion of each of the addresses of the remaining pagesets with the base data pattern.

6. The method of claim 4, wherein using the base data pattern comprises using a base pattern lookup table and bitwise XOR circuitry to generate the altered data patterns.

7. The method of claim 4, wherein the non-volatile memory is further characterized as having error correction, wherein the sequentially accessing is further characterized as reading at least a subset of the pages of the first pageset and invoking the error detection for each page of the first pageset and the accessing the remaining pagesets is further characterized as reading at least a subset of each of the remaining pagesets and invoking the error detection for each page of the remaining pagesets.

8. The method of claim 7, further comprising reading all of the remaining pagesets and the first pageset.

9. The method of claim 8, wherein the reading is further characterized as being performed according to an address transition pattern.

10. The method of claim 9, wherein the non-volatile memory is further characterized as having error detection, wherein the sequentially accessing is further characterized as invoking the error detection for each page of the first pageset and the accessing the remaining pagesets is further characterized as invoking error detection for each page of the remaining pagesets.

11. A method of testing a non-volatile memory, comprising:
defining a base data pattern for a first pageset of the non-volatile memory having a plurality of pages having a first subset of pages and a second subset of pages, wherein the pages of the plurality of pages comprise words, wherein the base data pattern is arranged so that each bitpair of the first subset of pages comprise even bitpairs from all of the words of the first subset of pages and that each bitpair of the second subset of pages comprise odd bitpairs formed from all of the words of the second subset of pages, wherein the base data pattern exhibits all possible bitpair transitions of the even bitpairs during sequential accesses of the pages of the first subset of pages and all possible bitpair transitions of the odd bitpairs during sequential accesses of the pages of second subset of pages;

storing the base data pattern in the first pageset; and sequentially accessing the pages of the plurality of pages of the first pageset.

12. The method of claim 11, wherein the non-volatile memory is further characterized as having error detection, wherein the sequentially accessing is further characterized as reading at least a subset of the pages of the first pageset and invoking the error detection for each page of the first pageset.

13. The method of claim 12, further comprising reading the first pageset according to an address transition pattern.

14. The method of claim 11, further comprising:

using the base data pattern to derive altered data patterns for remaining pagesets;

loading the altered data patterns in the remaining pagesets; and accessing the remaining pagesets.

15. The method of claim 14, wherein the using comprises bitwise XORing at least a portion of the address of each of the remaining pagesets with the base data pattern.

16. The method of claim 15, wherein the non-volatile memory is further characterized as having error detection, wherein the sequentially accessing is further characterized as reading at least a subset of the pages of the first pageset and invoking the error detection for each page of the first pageset and the accessing the remaining pagesets is further characterized as reading at least a subset of each of the remaining pagesets and invoking the error detection for each page of the remaining pagesets.

17. The method of claim 16, further comprising reading all of the remaining pagesets and the first pageset according to an address transition pattern.

18. A method of testing a non-volatile memory, comprising:

defining a base data pattern for a first pageset of the non-volatile memory having a plurality of pages, wherein the pages comprise words, wherein the base data pattern is arranged in even bitpairs formed from all of the words and exhibits all possible even bitpair transitions during sequential accesses of the pages of the plurality of pages;

storing the base data pattern in the first pageset;

sequentially accessing the pages of the plurality of pages of the first pageset;

using the base data pattern to derive altered data patterns for remaining pagesets;

loading the altered data patterns in the remaining pagesets; and accessing the remaining pagesets.

19. The method of claim 18, wherein the using comprises bitwise XORing at least a portion of each of the addresses of the remaining pagesets with the base data pattern.

20. The method of claim 18, wherein the non-volatile memory is further characterized as having error detection, wherein the sequentially accessing is further characterized as reading at least a subset of the pages of the first pageset and invoking the error detection for each page of the first pageset.

* * * * *